United States Patent
Stein et al.

(10) Patent No.: US 7,061,321 B1
(45) Date of Patent: Jun. 13, 2006

(54) LOW IMPEDANCE READ AMPLIFIER FOR MAGNETORESISTIVE HEAD

(75) Inventors: Anatoli B. Stein, Atherton, CA (US); Serguei Pantchenko, Scotts Valley, CA (US)

(73) Assignee: Guzik Technical Enterprises, Mountain View, CA (US)

(*) Notice: Subject to any disclaimer, the term of this patent is extended or adjusted under 35 U.S.C. 154(b) by 0 days.

(21) Appl. No.: 11/083,532

(22) Filed: Mar. 18, 2005

(51) Int. Cl.
*H03F 3/45* (2006.01)

(52) U.S. Cl. .......................... 330/258; 360/66; 360/67; 360/68; 360/46; 330/69; 330/302; 330/252; 330/253; 330/277; 330/259; 330/290

(58) Field of Classification Search ............ 360/66, 360/67, 68, 46; 330/258, 69, 302, 252, 253, 330/259, 290, 277; 327/65
See application file for complete search history.

(56) References Cited

U.S. PATENT DOCUMENTS 3,497,824 A * 2/1970 Goordman ............... 330/258
3,582,802 A * 6/1971 Weekes et al. ............ 330/258
2004/0085667 A1 * 5/2004 Chung et al. ............... 360/67

* cited by examiner

*Primary Examiner*—Michael B Shingleton
(74) *Attorney, Agent, or Firm*—Mark G. Lappin; Greenberg Traurig LLP

(57) ABSTRACT

A read amplifier system for connection through interconnects to a magnetoresistive (MR) head includes two input transistors, two bias transistors connected to the two input transistors by common source connections, a bias voltage control circuit connected to base terminals of the two bias transistors, a common mode voltage control circuit connected between first and base terminals of the input transistors to provide feedback from the first terminals to the base terminals, and a compensating circuit connected between the outputs of the amplifier system and the base terminals of the input transistors for providing a feedback from the outputs to the base terminals. The two base terminals of the input transistors are respectively connected to the interconnects of the MR head. The bias voltage control circuit applies a bias voltage to base terminals of the two bias transistors, and through the common sources to the base terminals of the input transistors, and thereby across the MR head. An input signal representing changes in resistance of the MR head is transmitted from the MR head to the input transistors and is amplified by the read amplifier system.

26 Claims, 3 Drawing Sheets

LOW IMPEDANCE READ AMPLIFIER FOR MAGNETORESISTIVE HEAD

FIELD OF THE INVENTION

The present invention relates to read amplifiers for magnetic recording device, such as disk drives, and more particularly, relates to low impedance read amplifiers for magnetoresistive (MR) heads.

BACKGROUND OF THE INVENTION

Magnetoresistive (MR) heads are often used for information sensing in magnetic data storage devices. A MR head typically includes an MR element that changes in resistance in correspondence with changing magnetic flux from data patterns on an adjacent magnetic disk surface. A measurement of changes of the resistance of the MR element is used detect binary data stored on the magnetic disk.

In ultrahigh-density magnetic disk drives, correspondingly high sensitivity and stability heads are needed to achieve desired performance. Tunneling magnetoresistive (TMR) are now being used to provide such performance.

A tunneling magnetoresistive (TMR) head generally employs two ferromagnetic layers separated by a thin insulator. Changes of the relative magnetic orientation of the two magnetic layers result in changes of the resistance of a tunneling current through the thin insulator. This is also known as tunneling magnetoresistance (TMR) effect. In TMR heads, typically, a bias voltage, or a bias current having a constant value, is applied across the TMR head, and the change in resistance of the TMR head is measured by sensing a change in the output current or voltage. The changes in the output are generally amplified by a read amplifier circuit.

It is nominally desirable to use a TMR head with a read amplifier in high performance disk drives. However, the impedance of a TMR head generally varies from 300 ohms to 1000 ohms, and prior art read amplifiers typically have a relatively high impedance, for example, as does the read amplifier disclosed in U.S. Patent Publication No. 2002/0176191A1. Generally, the input capacitance of prior art read amplifier and the high impedance of a TMR head form a RC integrator with a relatively large time constant and a relatively low cut-off at high frequencies. As a consequences the read bandwidth can be as low as 100 MHz, instead of at least 1 GHz as required for contemporary disk drives.

As a possible solution, a low impedance amplifier to the type disclosed in U.S. Pat. No. 6,667,842B2 might be used with a TMR head. However, that possible solution is not viable, particularly for drives with perpendicular recording is that the amplifier is not DC coupled due to the decoupling capacitors in the feedback circuits between the collectors and bases of its input transistors. As a result, the DC component of the recorded signal which is important for perpendicular recording, is lost in the read process.

Accordingly, there is a need for a low impedance read amplifier system that is capable of working with high-impedance TMR heads, with high read frequency.

SUMMARY OF THE INVENTION

The present invention provides a low impedance MR head read amplifier with DC connections and an MR impedance measurement circuit.

According to one preferred embodiment, the amplifier and measurement circuit includes first and second transistors, each including a first terminal, a second terminal, and a base terminal. The transistors can be field-effect transistors or bipolar junction transistors. If field-effect transistors are used, the first terminal, the second terminal, and the base terminal respectively are drain, source, and gate of the field-effect transistor, and for the bipolar junction transistors, the first terminal, the second terminal, and the base terminal respectively are collector, emitter, and base of the bipolar junction transistors. In the following exemplary embodiments, field-effect transistors are used, however, a person having ordinary skill in the art should appreciate that bipolar junction transistors also can be used to replace the field-effect transistors.

Each of the first and second transistors has a feedback resistor connected between its drain and the gate. The impedance of the transistor is lowered by the feedback resistor. Compared to the prior art amplifiers, in a preferred form, there is no capacitor connected between the drain and the gate in the feedback circuit, so that the DC component in the signal, which is important for perpendicular recording, will not be lost. The MR head includes two terminals respectively connected to the gates of the first and second transistors through interconnects and resistors.

The read amplifier system may further include third and a fourth field-effect transistors. The source of the third transistor is connected to the source of the first transistor, and a bypass capacitor connects the common source to the ground. The sources of the second and fourth transistors are connected, and a bypass capacitor connects the common source to the ground. The bypass capacitors reduce noise, which come from the third and fourth bias transistors, and improve the high-frequency performance of the output at the drains of the first and second transistors. The drains of the third and fourth transistors are respectively connected to a positive power supply +V. The drains of the first and second transistors are respectively connected to the positive power supply +V through pull-up resistors. The common sources of the transistors are connected to a negative power supply −V through pull-down resistors.

In one preferred form, the read amplifier further includes a bias voltage control circuit, which includes a digital-to-analog converter. The digital-to-analog converter is connected to a controller for generating a bias voltage. The bias voltage is converted, through amplifiers, to differential bias voltages +BIAS and −BIAS, which are respectively applied on the gates of the third and fourth transistors. Through the common sources of the transistors, the bias voltage is applied to the gates of the first and second transistors and thereby applied to the two terminals of the MR head.

The read amplifier may further include a common mode voltage control circuit, which provides a feedback from the drains to the gates, for controlling the output common mode voltage at the drains of the first and second transistors. The common mode voltage control circuit includes a first operational amplifier having a positive input connected to a DC voltage V-DC and a negative input connected to drains of the first and second transistors through resistors. If the common mode voltage at the output (i.e., the drains) of the first and second transistors deviates from V-DC, an error signal appears at the output of the first operational amplifier. Two extra amplifiers are connected to the output of the first operation amplifier. The error signal at the output of the first operational amplifier is amplified through the two extra amplifiers and is applied to the gates of the first and second transistors to adjust the input of the first and second transistors, and thereby to adjust the output common mode voltage to V-DC. The two extra amplifiers may include feedback circuits including resistors and capacitors connected between the input and output to adjust the time constant and amplification coefficient of the common mode voltage control circuit.

The common mode voltage control circuit measures the common mode voltage at the output of the read amplifier and makes adjustment of the current at the gates of the first and second transistors through operational amplifiers. The adjustment does not change the bias voltage on the gates of the first and second transistors because the bias voltage is the differential voltage at the MR head.

In another preferred embodiment, the read amplifier further includes a compensating circuit, which includes two analog-to-digital converters, a controller, a compensating digital-to-analog converter, and amplifiers. The two analog-to-digital converters are respectively connected to the outputs of the read amplifier system for measuring the output signals. The outputs of the analog-to-digital converters are connected to the controller, which is further connected to the compensating digital-to-analog converter. The controller generates an adjustment signal based on the output voltages transmitted from the analog-to-digital converters. The adjustment signal is transmitted to the digital-to-analog converter, which converts the adjustment signal to a compensating voltage signal. The compensating voltage signal is amplified by amplifiers connected to the digital-to-analog converter. The amplified voltage, which is a compensating voltage, is applied to the gates of the first and second transistors.

The compensating circuit provides a feedback from the output to the input of the read amplifier system. The compensating voltage adjusts the current at the gates of the first and second transistors to adjust the voltages at the drains of the first and second transistors. The value of the compensating voltage is calculated by the controller based on the voltages at the outputs of the read amplifier system transmitted through the analog-to-digital converters.

The read amplifier may further include a low frequency correction circuit, which includes two operational amplifiers respectively connected to the drains of the first and second transistors. The positive inputs of the operational amplifiers are respectively connected to the drains of the first and second transistors through resistors, and also connected to the ground through capacitors. The outputs of the operational amplifiers are respectively connected to the outputs of the read head amplifier system. The operational amplifiers amplify the filtered low frequency components and add them to the output signals.

The bias voltage generated by the bias voltage control circuit is applied to the two terminals of the MR head. As the MR head passes over an area on the surface of the storage medium having a change in magnetic flux, the resistance of the MR head changes, resulting in a change in the current of the MR head. The change in the current of the MR head is amplified through the read amplifier system and converted into an analog representation of the information stored on the storage medium.

DETAILED DESCRIPTION OF THE PREFERRED EMBODIMENTS

Figure 3:
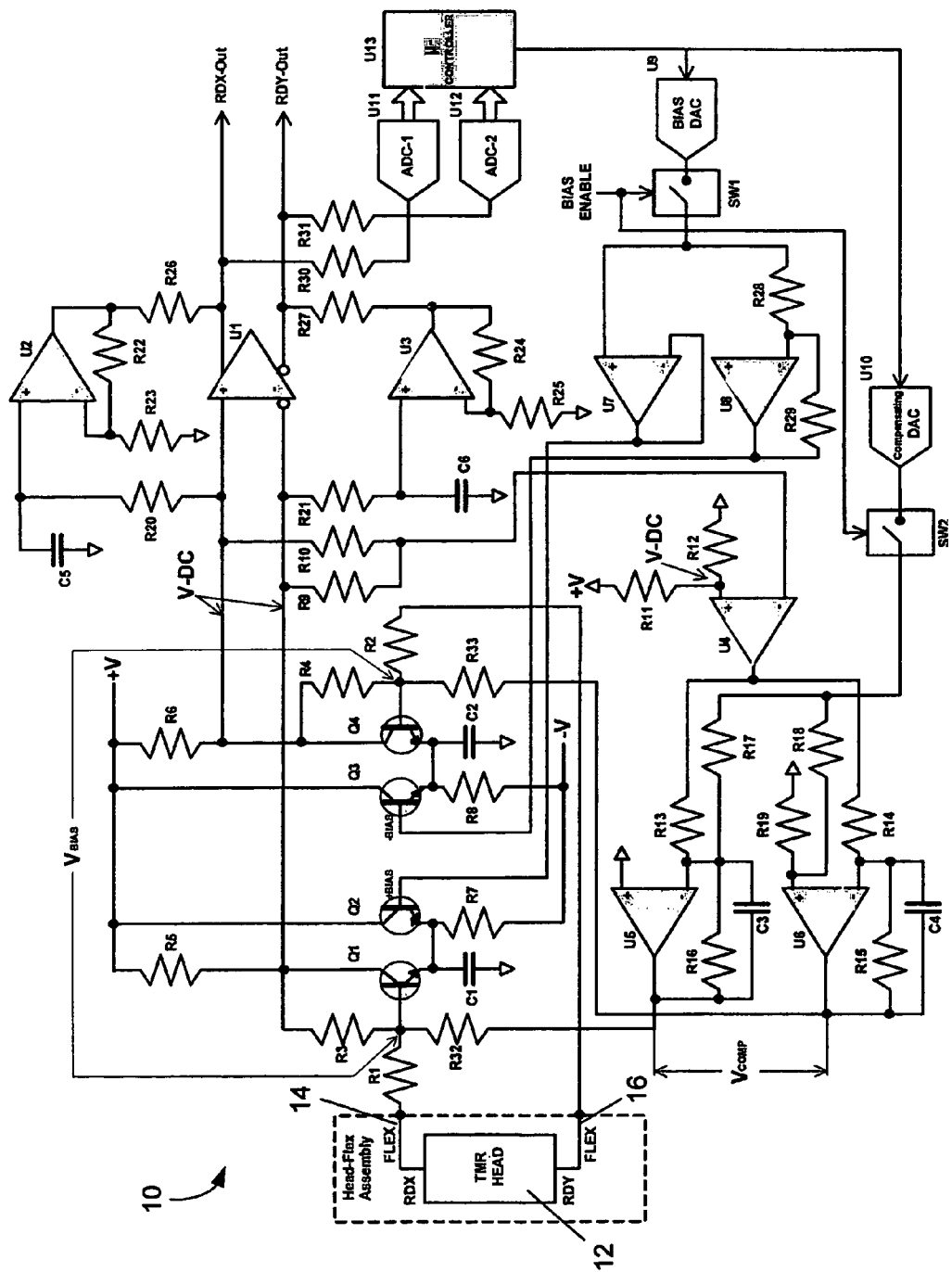
FIG. 3 shows another embodiment of the read amplifier system.

The present invention provides a low impedance read amplifier system for connection through interconnects to a read head, for example, a magnetoresistive (MR) read head, or a tunneling magnetoresistive (TMR) read head, in a magnetic storage system. According to one aspect of the present invention, the read head amplifier system employs four transistors coupled to the read head through flex interconnections. Field-effect transistors are used in the exemplary embodiments as described below and as shown in the drawings, but a person skilled in the art should understand that bipolar junction transistors also could be used instead of the field-effect transistors as shown in FIG. 3.

Figure 1:
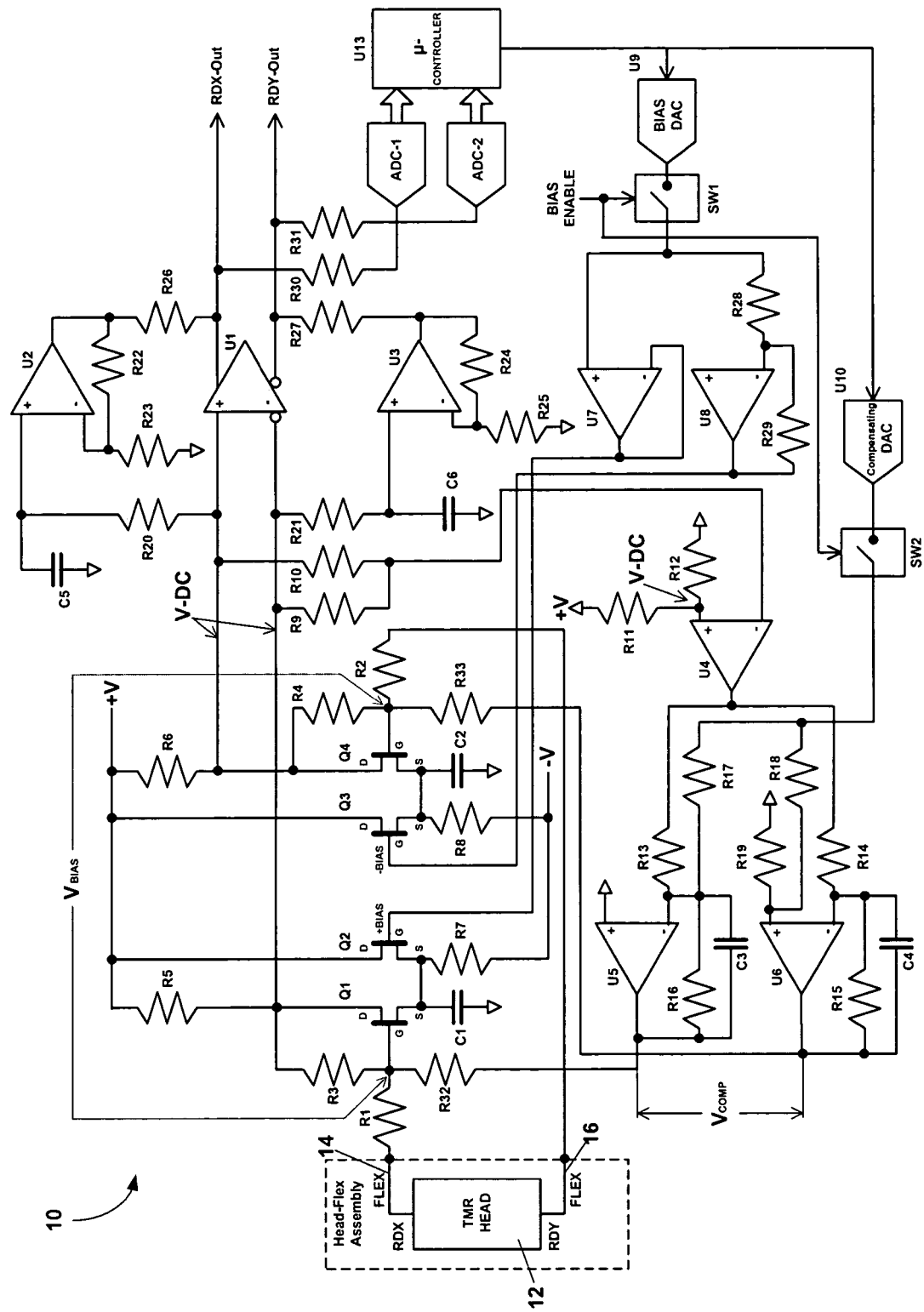
FIG. 1 is a schematic diagram of a read amplifier system according to one preferred embodiment of the present invention.

A schematic diagram of the read amplifier system according to one preferred embodiment of the present invention is shown in FIG. 1. As shown in FIG. 1, the low impedance read amplifier system 10 includes a first and second field-effect transistors Q1 and Q4. Each transistor includes a drain, a source, and a gate. Resistors R3 and R4 are respectively connected between the drains and gates of the two transistors Q1 and 04 to provide negative feedback from the drain to the gate for each transistor. The transistors Q1 and Q4 with negative feedback have low input impedance. The read amplifier system 10 further includes third and fourth field-effect transistors Q2 and Q3, each having a drain, a source, and a gate. The source of the transistor Q2 is connected to the source of the transistor Q1, and a bypass capacitor C1 connects the common source of the transistors Q1 and Q2 to the ground. The source of the transistor Q3 is connected to the source of the transistor Q4, and a bypass capacitor C2 connects the common source of the transistors Q3 and Q4 to the ground. The capacitors C1 and C2 reduce noise, which can come from the bias transistors Q2 and Q3, and improve the high-frequency performance of the input transistors Q1 and Q4. The drains of the transistors Q2 and Q3 are respectively connected to a positive power supply +V. The drains of the transistors Q1 and Q4 are respectively connected to the positive power supply +V through pull-up resistors R5 and R6. The common source of the transistors Q1 and Q2 is connected to a negative power supply −V through a resistor R7. The common source of the transistors Q3 and Q4 is connected to the negative power supply −V through a resistor R8.

The read amplifier system 10 can be used with a tunneling magnetoresistive (TMR) head or a giant magnetoresistive (GMR) head. As shown in FIG. 1, one terminal of a TMR head 12 is connected, through a flex and a resistor R1, to the gate of the transistor Q1, and the other terminal of the TMR head 12 is connected, through a flex and a resistor R2, to the gate of the transistor Q4. The resistance of the resistors R1 and R2 is relatively small, so that the resistors do not affect significantly the noise performance of the read amplifier system 10. Two bias voltages +BIAS and −BIAS are respectively applied to the gates of Q2 and Q3, and through the common sources of the transistors, the bias voltages are applied to the gates of the transistors Q1 and Q4, and thereby to the two terminals of the TMR head.

An output common mode voltage control circuit is connected to the drains of the transistors Q1 and Q4 to control the output common mode voltage. Resistors R9 and RIO are respectively connected to the drains of the transistors Q1 and Q4. The other ends of the resistors R9 and R10 are connected to a negative input of an operational amplifier U4. The positive input of the operational amplifier U4 is connected to a DC voltage V-DC. The DC voltage V-DC can be achieved by a circuit as shown in FIG. 1. The circuit includes a resistor R11 having one terminal connected to the positive power supply +V and the other terminal connected to another resistor R12, which has the other terminal connected to the ground. The V-DC voltage is the voltage taken at the point between the resistors R11 and R12. If the common mode voltage at the output of the transistors Q1 and Q4 deviates from V-DC, an error signal appears at the output of the operational amplifier U4.

The output of the operational amplifier U4 is connected to negative inputs of operational amplifiers U5 and U6 respectively through resistors R13 and R14. The positive input of operational amplifier U5 is connected to the ground. The positive input of the operational amplifier U6 is connected to the ground through a resistor R19. The output of the operational amplifier U5 is connected to the gate of the transistor Q1 through a resistor R32, and the output of the operational amplifier U6 is connected to the gate of the transistor Q4 through a resistor R33. A resistor R16 and a capacitor C3 are connected in parallel between the negative input and the output of the operational amplifier U5. A resistor RI5 and a capacitor C4 are connected in parallel between the negative input and the output of the operational amplifier U6. The operational amplifiers U4, U5, U6, and the resistors and capacitors connected to these operational amplifiers form a negative feedback circuit from the drains of the transistors Q1 and Q4 to the gates of the transistors Q1 and Q4. The time constant and amplification coefficient of this negative feedback loop can be adjusted by choosing or adjusting the value of the capacitors C3, C4 and the resistors R14, R16.

The common mode voltage control circuit measures the common mode voltage at the output of the read amplifier 10 and makes adjustment of the current at the gates of the transistors Q1 and Q4 through operational amplifiers to maintain the output common mode voltage of the read amplifier at a required level (e.g., V-DC).

In a starting mode, the bias voltages, +BIAS=−BIAS=0 volts, and the bias voltage across the TMR head and the gates of the transistors Q1 and Q4 is also equal to 0 volts. The voltages at the drains of the transistors Q1 and Q4 are positive, each approximately +1 Volt (which can be achieved by adjusting the value of +V). The currents through the feedback resistors R3, R4 pass through the resistors R32 and R33 respectively to the outputs of the operational amplifiers U5 and U6. These currents are adjusted through the common mode voltage control circuit, which includes the operational amplifiers U4, U5, and U6, such that the common mode voltage at the drains of the transistors Q1 and Q4 equals to V-DC, which is the voltage applied to the positive input of the operational amplifier U4. A differential amplifier U1 is connected to the drains of the transistors Q1 and Q4. The differential amplifier U1 suppresses the common mode voltage V-DC at the drains of the transistors Q1 and Q4, such that the DC voltages at outputs RDX-Out and RDY-Out equal to 0 Volts.

The read amplifier system 10 further includes a bias voltage control circuit, which, in one preferred form, includes a digital-to-analog converter (DAC) U9, which is connected to a controller U13. In one preferred embodiment, the controller U13 is connected to the outputs RDX-Out and RDY-Out through two analog-to-digital converters ADC-1 and ADC-2. The controller U13 sends signals to the DAC U9, which generates a bias voltage signal. The bias voltage signal is applied, through a switch SW1, respectively, to the positive input of an operational amplifier U7, and through a resistor R28 to the negative input of an operational amplifier U8. A feedback resistor R29 is connected between the output and the negative input of the operational amplifier U8. The operational amplifier U7 preferably has an amplification coefficient +K and the operational amplifier U8 (including the connected resistors R28 and R29) preferably has an amplification coefficient −K, and thereby the operational amplifiers U7 and U8 convert the bias voltage transmitted from the DAC U9 to the differential bias voltages +BIAS and −BIAS, which are respectively applied on the gates of the transistors Q2 and Q3. The switch SW1 is closed by a BIAS ENABLE signal when the bias voltage generated by the DAC U9 is applied to the switch SW1. The bias voltages −BIAS and +BIAS preferably have the same absolute value, i.e., |−BIAS|=|+BIAS|. The bias voltages +BIAS and −BIAS are connected to the gates of the transistors Q2 and Q3 and through the common source connections between the transistors Q1 and Q2 and between transistors Q3 and Q4, are applied to the gates of the transistors Q1 and Q4 and thereby to the TMR head 12. The bias voltage at the gates of the transistor Q1 and Q4 caused by the bias voltages +BIAS and −BIAS applied to the gates of the transistors Q2 and Q3 is indicated by $V_{BIAS}$ in FIG. 1.

The TMR head 12 is connected between two interconnect flexes. After the bias voltage $V_{BIAS}$ is applied to the TMR head 12, a differential voltage between two terminals 14, 16 of the flexes appears amplified at the drains of Q1 and Q4. This differential voltage does not affect the common mode voltage at the drains of the transistors Q1 and Q4, which is controlled by the output common voltage control circuit as described above. The differential voltage at the drains of the transistors Q1 and Q4 is amplified by the differential amplifier U1. The outputs of the differential amplifier U1 are respectively connected to the outputs RDX-Out and RDY-Out of the read amplifier system 10.

In one preferred embodiment, the read head amplifier system 10 further includes a compensating circuit, which, as shown in the exemplary embodiment in FIG. 1, includes two analog-to-digital converters ADC-1 and ADC-2, the controller U13, a digital-to-analog converter (DAC) U10, and operational amplifiers. The two analog-to-digital converters ADC-1 and ADC-2 are respectively connected to the outputs of the read amplifier system 10 through resistors R30 and R31 for measuring the output signals. The outputs of the analog-to-digital converters ADC-1 and ADC-2 are connected to the controller U13. The controller 13 is further connected to the compensating digital-to-analog converter (DAC) UI1, which is connected, through a switch SW2 and respectively through resistors R17 and R18, to the negative input of the operational amplifier U5 and the positive input of the operational amplifier U6. The analog-to-digital converters ADC-1 and ADC-2 measure the output voltages at RDX-Out and RDY-Out. If the common mode output voltages at RDX-Out and RDY-Out are not equal to 0 volts, the μ-controller U13 generates a control signal to the compensating DAC U10, which converts the control signal to a compensating voltage signal. The output voltage of the DAC U10 is applied to the operational amplifiers U5 and U6. The outputs of the operational amplifiers U5 and U6 provide a compensating voltage $V_{COMP}$ across the gates of the transistors Q1 and Q4. The compensating voltage $V_{COMP}$ adjusts the input of the transistors Q1 and Q4 to achieve 0 volt at the outputs RDX-Out and RDY-Out.

The compensating circuit provides a feedback from the output to the input of the read amplifier system 10. The feedback (i.e., the compensating voltage) adjusts the current at the gates of the transistors Q1 and Q4 to compensate the voltages at the drains of the transistors Q1 and Q4. The value of the compensating voltage is calculated by the controller 13 based on the voltages at the outputs RDX-Out and RDY-Out transmitted through the analog-to-digital converters ADC-1 and ADC-2.

As described above, the DC voltages at the drains of the transistors Q1 and Q4 are maintained equal to each other and equal to V-DC. The output impedance from the drains of the transistors Q1 and Q4 is low, because of the feedback circuits between the drains and the gates of the transistors Q1 and Q4. For the above reasons and for calculation purpose, the bias circuitry of the read amplifier system 10 can be simplified to an equivalent circuitry as shown in FIG. 2.

Figure 2:
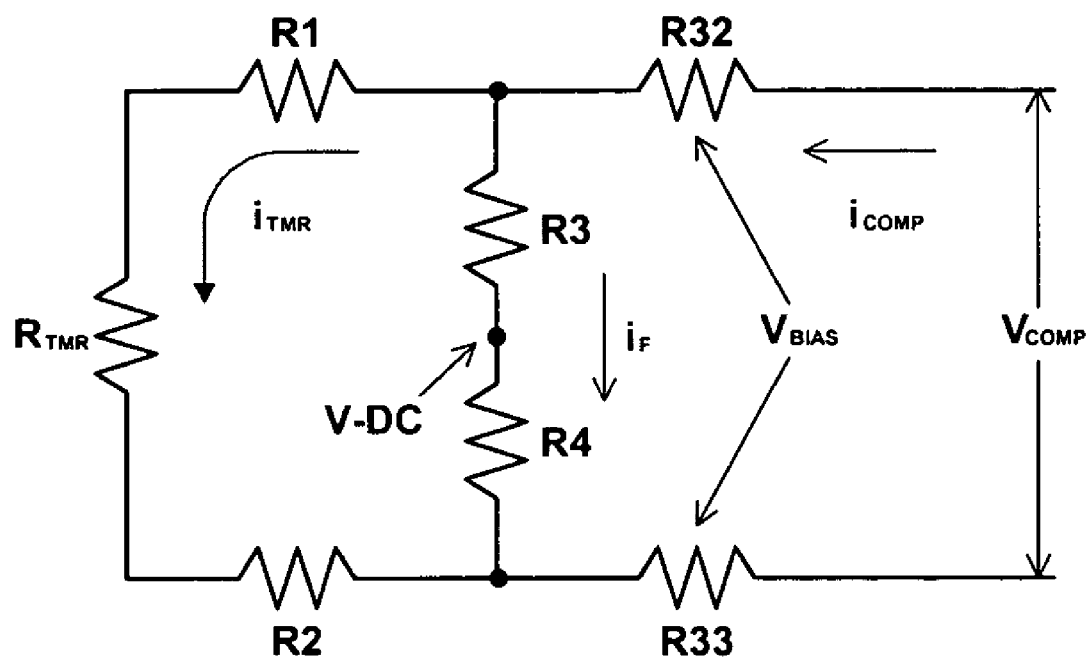
FIG. 2 shows a simplified circuit of the read amplifier system of FIG. 1.

The following equations, which are obtained based on the circuit scheme of FIG. 1 and the simplified circuit scheme of FIG. 2, explain the relations of the bias voltages $V_{BIAS}$, +BIAS, -BIAS, the impedance of the TMR head, and the voltage $V_{COMP}$ at the outputs of the operational amplifiers U5 and U6.

In the following equations:

$V_{BIAS}$ is the bias voltage between the gates of the transistors Q1 and Q4;

$$V_{BIAS} = |+BIAS| + |-BIAS|;$$

$R_{TMR}$ is the resistance of the TMR head;
$V_{COMP}$ is the compensation voltage between outputs of the operational amplifier U5 and U6;

R1=R2, R3=R4, and R32=R33;

$i_{TMR}$ is the current through the TMR head.
From the simplified circuit as shown in FIG. 2, it can be seen that:

$$i_{TMR} = i_{COM} - i_F \quad (1)$$

$$i_{COM} = \frac{V_{COMP} - V_{BIAS}}{2R_{32}} \quad (2)$$

$$i_F = \frac{V_{BIAS}}{2R_3} \quad (3)$$

From (1), (2), and (3):

$$i_{TMR} = \frac{V_{COMP} - V_{BIAS}}{2R_{32}} - \frac{V_{BIAS}}{2R_3} \text{ and} \quad (4)$$

$$R_{TMR} = \frac{V_{BIAS}}{i_{TMR}} - 2R_1 = \frac{2R_{32} \times R_3}{R_3\left(\frac{V_{COMP}}{V_{BIAS}} - 1\right) - R_{32}} - 2R_1$$

After the compensation procedure conducted by the compensating circuit from the outputs RDX-Out and RDY-Out to the gates of the transistors Q1 and Q4, the values of the variables in the right part of the equation (4) are known and the resistance $R_{TMR}$ of the TMR head can be determined.

The read amplifier system 10, through the compensation circuit as described above, maintains the outputs RDX-Out and RDY-Out at 0 volt, so that the circuitry of the amplifier system 10 can be simplified to the circuitry as shown in FIG. 2, and the impedance RTMR of the TMR head 12 can be measured with high accuracy.

The output impedance at the source of the transistors Q1 or Q4 and associated capacitor C1 or C2 form a resistance-capacitance circuit, which has a time constant $R_sC1$ for the transistor Q1 (or $R_sC2$ for the transistor Q4), where $R_s$ is the output impedance at the source of the transistor Q1 (or Q4). This resistance-capacitance circuit results in a low frequency roll-off of the circuit. To compensate this low frequency roll-off, a low frequency correction circuit, which includes operational amplifiers U2 and U3 is connected to the drains of the transistors Q1 and Q4. The positive input of the operational amplifier U2 is connected to the drain of the transistor Q4 through a resistor R20, and also connected to the ground through a capacitor C5. The positive input of the operational amplifier U3 is connected to the drain of the transistor Q1 through a resistor R21, and also connected to the ground through a capacitor C6. The negative input of the operational amplifier U2 is connected to the ground through a resistor R23 and is also connected to the output of the operational amplifier U2 through a resistor R22. The negative input of the operational amplifier U3 is connected to the ground through a resistor R25 and is also connected to the output of the operational amplifier U3 through a resistor R24. The time constant of each RC circuit is approximately equal to the time constant $R_sC1$ (or $R_sC2$) of the resistance-capacitance circuit at the source of the transistor Q1 (or Q4). The single pole integrated circuitry filters the read-back signals, and the operational amplifiers U2 and U3 amplify the filtered low frequency components and add them to the output signals through the resistors R26 and R27, which are respectively connected between the outputs of the operational amplifiers U2 and U3 and the outputs RDX-Out and RDY-Out.

The resistance of the resistors R1 and R2 between the gates of Q1 and Q4 and the flexes of the TMR head 12 are preferably selected in order to match the input impedance of the read amplifier system 10 to the flex impedance. In one preferred form, the values of the resistors R1 and R2 are about 20 ohms, so that they do not affect significantly the noise performance of the read amplifier system 10.

While the claimed invention has been described in detail and with reference to specific embodiments thereof, it will be apparent to one of ordinary skill in the art that various changes and modifications can be made to the claimed invention without departing from the spirit and scope thereof. Thus, for example those skilled in the art will recognize, or be able to ascertain, using no more than routine experimentation, numerous equivalents to the specific substances and procedures described herein. Such equivalents are considered to be within the scope of this invention, and are covered by the following claims.

What is claimed is:

1. An amplifier system for connection through interconnects to a read head, said amplifier system comprising:
  a first and second transistors each having a first terminal, a second terminal, and a base terminal, wherein said two base terminals are respectively connected to the interconnects through which an input signal is transmitted from the read head to said transistors, wherein said first terminals are connected to outputs of said amplifier system;
  a bias voltage control circuit connected to said first and second transistors adapted to provide a bias voltage across the base terminals of the first and second transistors; and
  a common mode voltage control circuit connected between first terminals of the first and second transistors and the base terminals of the first and second transistors to provide feedbacks from the first terminals to the base terminals of the first and second transistors, wherein said bias voltage control circuit comprises a third and fourth transistors each having a first terminal, a second terminal, and a base terminal, wherein said second terminals of said first and third transistors are connected, and said second terminals of said second and fourth transistors are connected, wherein bias voltages are respectively applied to the base terminals of said third and fourth transistors, and wherein said bias voltage control circuit further comprises a voltage generation circuit for generating a bias voltage, said voltage generation circuit having an output connected to an amplification circuit with an amplification coefficient +K and also connected to another amplification circuit with an amplification coefficient −K, and wherein outputs of the amplification circuits are connected to base terminals of said third and fourth transistors, providing bias voltages +BIAS and −BIAS on said base terminals.

2. An amplifier system according to claim 1, wherein each transistor has a feedback circuit between said first terminal and said base terminal.

3. An amplifier system according to claim 1, wherein the second terminal of each of said first and second transistors is grounded through a bypass capacitor.

4. An amplifier system according to claim 1, wherein said first and second transistors are field-effect transistors, and said first, second, and base terminals respectively are drains, sources, and gates of said field-effect transistors.

5. An amplifier system according to claim 1, wherein said first and second transistors are bipolar junction transistors, and said first, second, and base terminals respectively are collectors, emitters, and bases of said bipolar junction transistors.

6. An amplifier system according to claim 1 further comprising an operational amplifier having inputs connected to said first terminals of said first and second transistors, wherein said operational amplifier reduces the common mode voltages at said first terminals to a predetermined value at outputs of said amplifier system.

7. An amplifier system according to claim 1, wherein said bias voltage control circuit is connected to the second terminals of the first and second transistors.

8. An amplifier system for connection through interconnects to a read head, said amplifier system comprising:
a first and second transistors each having a first terminal, a second terminal, and a base terminal, wherein said two base terminals are respectively connected to the interconnects through which an input signal is transmitted from the read head to said transistors, wherein said first terminals are connected to outputs of said amplifier system;
a bias voltage control circuit connected to said first and second transistors adapted to provide a bias voltage across the base terminals of the first and second transistors; and
a common mode voltage control circuit connected between first terminals of the first and second transistors and the base terminals of the first and second transistors to provide feedbacks from the first terminals to the base terminals of the first and second transistors,
wherein said bias voltage control circuit comprises a controller for controlling said bias voltage applied across said base terminals of said first and second transistors,
and wherein said bias voltage control circuit further comprises two analog-to-digital converters respectively connected between said outputs of said amplifier system and said controller for measuring output voltages at said outputs.

9. An amplifier system according to claim 1, wherein said bias voltage control circuit comprises a controller for controlling said bias voltage applied across said base terminals of said first and second transistors.

10. An amplifier system according to claim 8, wherein said bias voltage control circuit further comprises a digital-to-analog converter connected to said controller for providing a bias voltage to said base terminals of said first and second transistors.

11. An amplifier system according to claim 10, wherein an output of said digital-to-analog converter is connected to an amplification circuit with an amplification coefficient +K and is connected to another amplification circuit with an amplification coefficient −K, and wherein outputs of the amplification circuits are applied to the base terminals of said first and second transistors, providing said bias voltage across said base terminals.

12. An amplifier system according to claim 11, wherein said bias voltage control circuit further comprises a third and fourth transistors each having a first terminal, a second terminal, and a base terminal, wherein said second terminals of said first and third transistors are connected, and said second terminals of said second and fourth transistors are connected, wherein said outputs of said amplification circuits are respectively connected to the base terminals of said third and fourth transistors.

13. An amplifier system according to claim 1, wherein said common mode voltage control circuit includes a first operational amplifier having one input connected to the first terminals of said first and second transistors, and the other input connected to a reference voltage, wherein said first operational amplifier compares a common mode voltage at said first terminals of said first and second transistors to said reference voltage and provide a feedback to the base terminals of said first and second transistors to maintain said common mode voltage at the first terminals substantially equal to said reference voltage.

14. An amplifier system according to claim 13, wherein said common mode voltage control circuit includes two resistors, one connected between said first terminal of said first transistor and said input of said first operational amplifier, and the other connected between said first terminal of said second transistor and said input of said first operational amplifier.

15. An amplifier system according to claim 14, wherein said common mode voltage control circuit further comprises a second and third operational amplifiers connected to an output of said first operational amplifier, and wherein outputs of said second and third operational amplifiers are connected to said base terminals of said first and second transistors.

16. An amplifier system for connection through interconnects to a read head, said amplifier system comprising:
a first and second transistors each having a first terminal, a second terminal, and a base terminal, wherein said two base terminals are respectively connected to the interconnects through which an input signal is transmitted from the read head to said transistors, wherein said first terminals are connected to outputs of said amplifier system;
a bias voltage control circuit connected to said first and second transistors adapted to provide a bias voltage across the base terminals of the first and second transistors; and
a common mode voltage control circuit connected between first terminals of the first and second transistors and the base terminals of the first and second transistors to provide feedbacks from the first terminals to the base terminals of the first and second transistors, wherein said common mode voltage control circuit includes a first operational amplifier having one input connected to the first terminals of said first and second transistors, and the other input connected to a reference voltage, wherein said first operational amplifier compares a common mode voltage at said first terminals of said first and second transistors to said reference voltage and provide a feedback to the base terminals of said first and second transistors to maintain said common mode voltage at the first terminals substantially equal to said reference voltage, and wherein said common mode voltage control circuit includes two resistors, one connected between said first terminal of said first transistor and said input of said first operational amplifier, and the other connected between said first terminal of said second transistor and said input of said first operational amplifier, and wherein said common mode voltage control circuit further comprises a second and third operational amplifiers connected to an output of said first operational amplifier, and wherein outputs of said second and third operational amplifiers are connected to said base terminals of said first and second transistors, and wherein said second and third operational amplifiers each include a feedback circuit having at least one resistor and at least one capacitor connected in parallel between the negative input and the output of the operational amplifier to adjust a time constant and amplification coefficient of said common mode voltage control circuit.

17. An amplifier system according to claim 1, wherein each base terminal of said first and second transistors is connected to the interconnect through a resistor, and wherein the resistance of said resistors are selected, such that an input impedance of said amplifier system is matched to the impedance of said interconnects.

18. An amplifier system according to claim 1 further comprising a compensating circuit connected between said outputs of said amplifier system and said base terminals of said first and second transistors for providing a feedback from said outputs to said base terminals, said feedback comprising a compensating voltage across said base terminals of said first and second transistors.

19. An amplifier system according to claim 18, wherein said compensating circuit comprises a controller for controlling said compensating voltage applied across said base terminals of said first and second transistors based on voltages at said outputs of said amplifier system.

20. An amplifier system for connection through interconnects to a read head, said amplifier system comprising:

a first and second transistors each having a first terminal, a second terminal, and a base terminal, wherein said two base terminals are respectively connected to the interconnects through which an input signal is transmitted from the read head to said transistors, wherein said first terminals are connected to outputs of said amplifier system;

a bias voltage control circuit connected to said first and second transistors adapted to provide a bias voltage across the base terminals of the first and second transistors;

a common mode voltage control circuit connected between first terminals of the first and second transistors and the base terminals of the first and second transistors to provide feedbacks from the first terminals to the base terminals of the first and second transistors; and a compensating circuit connected between said outputs of said amplifier system and said base terminals of said first and second transistors for providing a feedback from said outputs to said base terminals, said feedback comprising a compensating voltage across said base terminals of said first and second transistors, wherein said compensating circuit comprises a controller for controlling said compensating voltage applied across said base terminals of said first and second transistors based on voltages at said outputs of said amplifier system and wherein said compensating circuit further comprises two analog-to-digital converters respectively connected between said outputs of said amplifier system and said controller for measuring output voltages at said outputs.

21. An amplifier system according to claim 20, wherein said compensating circuit further comprises a digital-to-analog converter connected to said controller for providing a bias voltage to said base terminals of said first and second transistors.

22. An amplifier system according to claim 21, wherein an output of said digital-to-analog converter is connected to a positive input of an operational amplifier and is also connected to a negative input of another operational amplifier, and wherein outputs of the operational amplifiers are connected to base terminals of said first and second transistors, providing said compensating voltage across said base terminals.

23. An amplifier system for connection through interconnects to a read head, said amplifier system comprising:

a first and second transistors each having a first terminal, a second terminal, and a base terminal, wherein said two base terminals are respectively connected to the interconnects through which an input signal is transmitted from the read head to said transistors, wherein said first terminals are connected to outputs of said amplifier system;

a bias voltage control circuit connected to said first and second transistors adapted to provide a bias voltage across the base terminals of the first and second transistors;

a common mode voltage control circuit connected between first terminals of the first and second transistors and the base terminals of the first and second transistors to provide feedbacks from the first terminals to the base terminals of the first and second transistors; and a low frequency correction circuit, said low frequency correction circuit comprising two resistor-capacitor (RC) circuits respectively connected to said first terminals of said first and second transistors, wherein each RC circuit has an operational amplifier having an input connected to said RC circuit and having an output connected to said output of said amplifier system.

24. An amplifier system for connection through interconnects to a read head, said amplifier system comprising:

a first and second transistors each having a first terminal, a second terminal, and a base terminal, wherein said two base terminals are respectively connected to the interconnects through which an input signal is transmitted from the read head to said transistors, wherein said first terminals are connected to outputs of said amplifier system;

a bias voltage control circuit connected to said first and second transistors adapted to provide a bias voltage across the base terminals of the first and second transistors;

a common mode voltage control circuit connected between first terminals of the first and second transistors and the base terminals of the first and second transistors to provide feedbacks from the first terminals to the base terminals of the first and second transistors;

a compensating circuit connected between said outputs of said amplifier system and said base terminals of said first and second transistors for providing a feedback from said outputs to said base terminals, said feedback comprising a compensating voltage across said base terminals of said first and second transistors; and a low frequency correction circuit connected to said outputs of said amplifier system, said low frequency correction circuit comprising at least one resistor-capacitor (RC) circuit for filtering low frequency signals and adding said low frequency signals to said outputs of said amplifier system.

25. An amplifier system for connection through interconnects to a read head, said amplifier system comprising:

a first and second transistors each having a first terminal, a second terminal, and a base terminal, wherein said two base terminals are respectively connected to the interconnects through which an input signal is transmitted from the read head to said transistors, wherein said first terminals are connected to outputs of said amplifier system;

a third and fourth transistors each having a first terminal, a second terminal, and a base terminal, wherein said second terminals of said first and third transistors are connected, and said second terminals of said second and fourth transistors are connected;

a bias voltage control circuit connected to the base terminals of said third and fourth transistors for providing bias voltages to the base terminals of said third and fourth transistors;

a common mode voltage control circuit connected between first terminals of the first and second transistors and the base terminals of the first and second transistors to provide feedbacks from the first terminals to the base terminals of the first and second transistors;

a compensating circuit connected between said outputs of said amplifier system and said base terminals of said first and second transistors for providing a feedback from said outputs to said base terminals said feedback comprising a compensating voltage across said base terminals of said first and second transistors; and a low frequency correction circuit connected to said outputs of said amplifier system, said low frequency correction circuit comprising at least one resistor-capacitor (RC) circuit for filtering low frequency signals and adding said low frequency signals to said outputs of said amplifier system.

26. An amplifier system according to claim 8, wherein said bias voltage control circuit comprises a third and fourth transistors each having a first terminal, a second terminal, and a base terminal, wherein said second terminals of said first and third transistors are connected, and said second terminals of said second and fourth transistors are connected, wherein bias voltages are respectively applied to the base terminals of said third and fourth transistors.

* * * * *